(12) United States Patent
Hu et al.

(10) Patent No.: US 9,268,349 B2
(45) Date of Patent: Feb. 23, 2016

(54) CIRCUIT AND METHOD FOR OPTIMIZING INPUT VOLTAGE RANGE OF IC CHIP

(71) Applicant: SHENZHEN CHINA STAR OPTOELECTRONICS TECHNOLOGY CO., LTD., Shenzhen, Guangdong (CN)

(72) Inventors: Anle Hu, Shenzhen (CN); Dan Cao, Shenzhen (CN)

(73) Assignee: SHENZHEN CHINA STAR OPTOELECTRONICS TECHNOLOGY CO., LTD., Shenzhen (CN)

(*) Notice: Subject to any disclaimer, the term of this patent is extended or adjusted under 35 U.S.C. 154(b) by 5 days.

(21) Appl. No.: 14/240,377

(22) PCT Filed: Jan. 21, 2014

(86) PCT No.: PCT/CN2014/071011
§ 371 (c)(1),
(2) Date: Jun. 5, 2014

(87) PCT Pub. No.: WO2015/081628
PCT Pub. Date: Jun. 11, 2015

(65) Prior Publication Data
US 2015/0160666 A1    Jun. 11, 2015

(30) Foreign Application Priority Data
Dec. 6, 2013    (CN) .......................... 2013 1 0655572

(51) Int. Cl.
*H03L 7/00*    (2006.01)
*G05F 1/56*    (2006.01)

(52) U.S. Cl.
CPC ........................................ *G05F 1/56* (2013.01)

(58) Field of Classification Search
CPC ........................................................ G05F 1/56
USPC ........................................................ 327/142
See application file for complete search history.

(56) References Cited

U.S. PATENT DOCUMENTS

| 7,615,976 B2 | 11/2009 | Huang et al. | 323/273 |
| 2003/0235058 A1 | 12/2003 | Toyoshima et al. | 363/13 |
| 2004/0113595 A1 | 6/2004 | Sugiura | 323/273 |
| 2008/0297212 A1* | 12/2008 | Grasso et al. | 327/143 |

FOREIGN PATENT DOCUMENTS

| CN | 101212147 A | 7/2008 |
| CN | 101826791 A | 9/2010 |
| CN | 102131328 A | 7/2011 |
| CN | 102158067 A | 8/2011 |
| CN | 103401541 A | 11/2013 |
| EP | 2354881 A | 8/2011 |
| JP | 201227522 A | 2/2012 |

OTHER PUBLICATIONS

International Search Report dated Aug. 24, 2014.

* cited by examiner

*Primary Examiner* — Daniel Puentes
(74) *Attorney, Agent, or Firm* — Stein IP, LLC

(57) ABSTRACT

The present invention relates to a circuit and method for optimizing an input voltage range of an IC chip. In the circuit, a pull-up unit, receives an input voltage and then outputs a corresponding voltage level; a trigger unit compares the voltage level output by the pull-up unit with a given threshold voltage, and outputs an enabling signal of corresponding level to an enabling end of the IC chip based on the comparison result, so as to control the IC chip to start/stop; and a voltage stabilizing unit receives the voltage levels output by the pull-up unit and the trigger unit, and then outputs a voltage of corresponding level to the pull-up unit based on the voltage levels output by the pull-up unit and the trigger unit, so that the voltage level output by the pull-up unit is higher than or equal to the threshold voltage and thereby the IC chip starts operation, or so that the voltage level output by the pull-up unit is maintained to be higher than or equal to the threshold voltage and thereby the operation of the IC chip is not affected by variations of the input voltage. The present invention can ensure that when the input voltage is changed within a certain range the IC still can work in a normal manner.

6 Claims, 1 Drawing Sheet

CIRCUIT AND METHOD FOR OPTIMIZING INPUT VOLTAGE RANGE OF IC CHIP

FIELD OF THE INVENTION

The present disclosure relates to a switching power supply technology, and particularly, to a circuit and a method for optimizing an input voltage range of an IC chip.

BACKGROUND OF THE INVENTION

After an enabling end (EN) of an IC chip receives an input power, an initialization process is performed in the IC chip. After the initialization process is completed, an internal trigger level (namely an enabling level) becomes a high level, and the IC chip accordingly starts normal operation. During normal operation of the IC chip, if the voltage of the input power is instable and fluctuates, the level of the enabling end EN may be pulled down, so that the IC chip stops operating.

SUMMARY OF THE INVENTION

Aiming at the above-mentioned problem, the present disclosure provides a circuit and a method for optimizing an input voltage range of an IC chip, for ensuring that the IC chip still can work in a normal manner when the input voltage is changed within a certain range.

The present disclosure provides a circuit for optimizing an input voltage range of an IC chip, which comprises:

a pull-up unit, an input end thereof electrically connected with an input voltage, and for pulling up a voltage level of an output end thereof based on the input voltage;

a trigger unit, electrically connected between the pull-up unit and an enabling end of the IC chip, for comparing the voltage level output by the pull-up unit with a given threshold voltage, and outputting an enabling signal of corresponding level to the enabling end of the IC chip based on the comparison result, so as to control the IC chip to start/stop; and a voltage stabilizing unit, a first input end of which is electrically connected to the output end of the pull-up unit, a second input end of which is electrically connected to the output end of the trigger unit, and an output end of which is electrically connected to a control end of the pull-up unit, for outputting a voltage of corresponding level to the pull-up unit based on the voltages output by the pull-up unit and the trigger unit, so that the voltage level output by the pull-up unit is higher than or equal to the threshold voltage and thereby the IC chip starts operation, or so that the voltage level output by the pull-up unit is maintained to be higher than or equal to the threshold voltage and thereby the operation of the IC chip is not affected by variations of the input voltage.

The above-mentioned pull-up unit includes a P-type switching transistor, a pull-up resistor and a voltage dividing resistor; the source of the P-type switching transistor is electrically connected to a first end of the pull-up resistor, and used as the input end of the pull-up unit to receive the input voltage; the drain of the P-type switching transistor is used as the output end of the pull-up unit, and electrically grounded via the voltage dividing resistor; and the gate of the P-type switching transistor is used as the control end of the pull-up unit, and electrically connected to a second end of the pull-up resistor.

The above-mentioned trigger unit includes a Schmitt trigger and an inverter connected in series, wherein an input end of the Schmitt trigger is used as the input end of the trigger unit and electrically connected to the output end of the pull-up unit, and an output end of the inverter is used as the output end of the trigger unit and electrically connected to the enabling end of the IC chip.

The above-mentioned voltage stabilizing unit includes a first, a second and a third Zener diodes connected in series and a first and a second switching transistors; the cathode of the first Zener diode is electrically connected to the control end of the pull-up unit, the anode of the first Zener diode is electrically connected to the cathode of the second Zener diode, the anode of the second Zener diode is electrically connected to the cathode of the third Zener diode, and the anode of the third Zener diode is electrically grounded; a first electrode and a second electrode of the first switching transistor are electrically connected to both ends of the third Zener diode respectively, and the gate of the first switching transistor is electrically connected to the output end of the pull-up unit; and a first electrode and a second electrode of the second switching transistor are electrically connected to the cathode of the second Zener diode and the anode of the third Zener diode respectively, and the gate of the second switching transistor is electrically connected to the output end of the trigger unit.

The above-mentioned first and second switching transistors are N-type switching transistors.

The above-mentioned first and second switching transistors are P-type switching transistors.

In addition, the present disclosure also provides a method for a circuit optimized with an input voltage range of an IC chip, including steps of:

receiving, by a pull-up unit, an input voltage, and then outputting a corresponding voltage level;

comparing, by a trigger unit, the voltage level output by the pull-up unit with a given threshold voltage, and outputting an enabling signal of corresponding level to an enabling end of the IC chip based on the comparison result, so as to control the IC chip to start/stop; and receiving, by a voltage stabilizing unit, the voltage levels output by the pull-up unit and the trigger unit, and then outputting a voltage of corresponding level to the pull-up unit based on the voltage levels output by the pull-up unit and the trigger unit, so that the voltage level output by the pull-up unit is higher than or equal to the threshold voltage and thereby the IC chip starts operation, or so that the voltage level output by the pull-up unit is maintained to be higher than or equal to the threshold voltage and thereby the operation of the IC chip is not affected by variations of the input voltage.

Compared with the prior art, the circuit and the method provided in the present disclosure for optimizing the input voltage range of the IC chip ensure that the IC still can work in a normal manner when the input voltage is changed within a certain range.

BRIEF DESCRIPTION OF THE DRAWINGS

The accompanying drawings are provided for further understanding of the present disclosure, constitute a part of the description for interpreting the present disclosure together with the embodiments of the present disclosure, rather than limiting the present disclosure. In the accompanying drawings.

DETAILED DESCRIPTION OF THE EMBODIMENTS

Figure 1:
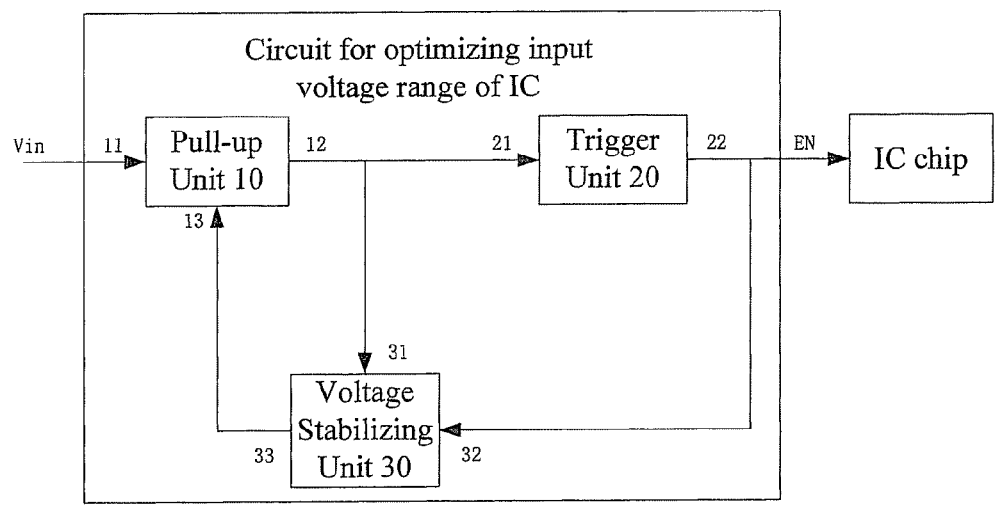
FIG. 1 is a schematic diagram of composition of a circuit for optimizing an input voltage range of an IC chip according to the present disclosure.

FIG. 1 shows a composition schematic diagram of a circuit for optimizing range of an input voltage Vin of an IC chip according to the present disclosure, and the circuit includes:

A pull-up unit 10, having an input end 11 electrically connected with the input voltage Vin, and configured to pull up the voltage level of an output end 12 according to the input voltage Vin;

A trigger unit 20, having an input end 21 electrically connected to the output end 12 of the pull-up unit 10 and an output end 22 electrically connected to the enabling end EN of the IC chip, and configured to compare the voltage level output by the pull-up unit 10 with a given threshold voltage VT+, wherein An enabling signal of low level is output by the trigger unit 20 to the enabling end EN of the IC chip when the voltage level output by the pull-up unit 10 is lower than the given threshold voltage VT+, so that the IC chip is incapable of operation, and An enabling signal of high level is output by the trigger unit 20 to the enabling end EN of the IC chip when the voltage level output by the pull-up unit 10 is higher than or equal to the given threshold voltage VT+, so that the IC chip starts to operate;

A voltage stabilizing unit 30, having a first input end 31 electrically connected to the output end 12 of the pull-up unit 10, a second input end 32 electrically connected to the output end 22 of the trigger unit 20 and an output end 33 electrically connected to a control end 13 of the pull-up unit 10, and configured to output a corresponding voltage stabilizing level to the pull-up unit 10 according to the voltages output by the pull-up unit 10 and the trigger unit 20, so that in a first phase, the voltage level output by the pull-up unit 10 is higher than or equal to the threshold voltage VT+, so that the IC chip starts to operate, and in a second phase, the voltage level output by the pull-up unit 10 is maintained to be higher than or equal to the threshold voltage VT+, so that the operation of the IC chip is not affected by variations of the input voltage Vin.

Figure 2:
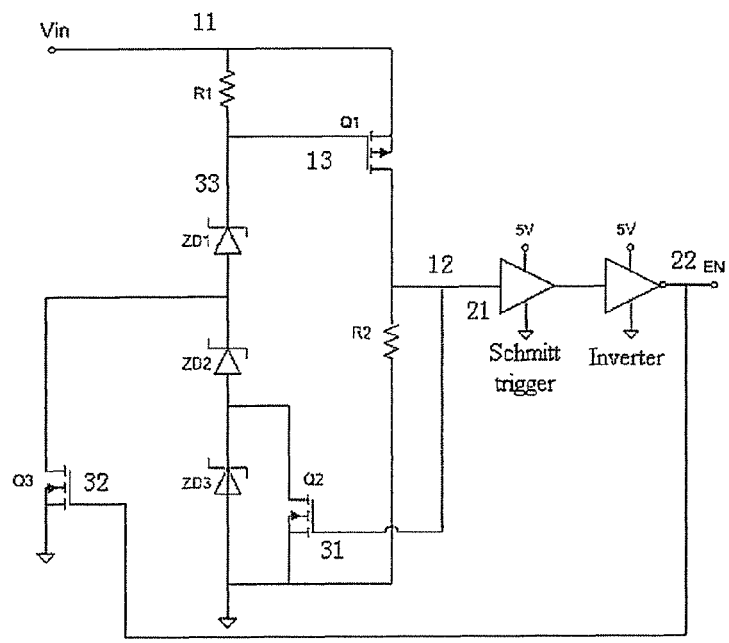
FIG. 2 is a schematic diagram of circuit connection in one embodiment of the circuit for optimizing the input voltage range of the IC chip according to the present disclosure.

FIG. 2 is a schematic diagram showing circuit connection of one embodiment of the circuit for optimizing the range of the input voltage Vin of the IC chip according to the present disclosure.

In the case, the pull-up unit 10 includes a P-type switching transistor Q1, a pull-up resistor R1 and a voltage dividing resistor R2. The source of the P-type switching transistor Q1 is electrically connected to a first end of the pull-up resistor R1, and used as the input end 11 of the pull-up unit 10 to receive the input voltage Vin. The drain of the P-type switching transistor Q1 is used as the output end 12 of the pull-up unit 10 and is electrically grounded via the voltage dividing resistor R2. The gate of the P-type switching transistor Q1 is used as the control end 13 of the pull-up unit 10 and is electrically connected to a second end of the pull-up resistor R1.

In this case, the input voltage Vin is 20V, and it fluctuates within a certain range, such as a range of 20V to 6V.

The trigger unit 20 includes a Schmitt trigger (S Trigger) and an inverter NOT connected in series with each other, an input end of the S Trigger is used as the input end 21 of the trigger unit 20 and electrically connected to the output end 12 of the pull-up unit 10, and an output end of the inverter NOT is used as the output end 22 of the trigger unit 20 and electrically connected to the enabling end EN of the IC chip.

In the case, the threshold voltage VT+ of the S Trigger is 5V. That is, when the voltage level input to the S Trigger is lower than 5V, the S Trigger outputs a high level voltage, and then, after this high level voltage is inverted by the inverter NOT, the enabling signal of low level is output to the enabling end EN of the IC chip. When the voltage level input to the S Trigger is higher than or equal to 5V, the S Trigger outputs a low level voltage, and after this low level voltage is inverted by the inverter NOT, the enabling signal of high level is output to the enabling end EN of the IC chip.

The voltage stabilizing unit 30 includes a first, a second and a third Zener diodes ZD1, ZD2 and ZD3 connected in series, and a first and a second N-type switching transistors Q2 and Q3.

In the case, the cathode of the first Zener diode ZD1 is electrically connected to the control end 13 of the pull-up unit 10, namely the second end of the pull-up resistor R1, the anode of the first Zener diode ZD1 is electrically connected to the cathode of the second Zener diode ZD2, the anode of the second Zener diode ZD2 is electrically connected to the cathode of the third Zener diode ZD3, and the anode of the third Zener diode ZD3 is electrically grounded.

The source of the first N-type switching transistor Q2 is electrically connected to the cathode of the third Zener diode ZD3 in the voltage stabilizing unit 30, and the drain thereof is electrically grounded, and the gate of the first N-type switching transistor Q2 is electrically connected to the output end 12 of the pull-up unit 10, so that the cathode of the third Zener diode ZD3 is connected to the ground under the action of the high level voltage output by the pull-up unit 10, that is, two ends of the third Zener diode ZD3 are short-circuited.

The source of the second N-type switching transistor Q3 is electrically connected to the cathode of the second Zener diode ZD2 in the voltage stabilizing unit 30, and the drain thereof is electrically grounded, and the gate of the second N-type switching transistor Q3 is electrically connected to the output end 22 of the trigger unit 20, so that the cathode of the second Zener diode ZD2 is connected to the ground under the action of the high level voltage output by the trigger unit 20, that is, the second and third Zener diodes ZD2 and ZD3 are short-circuited simultaneously.

In this case, the reverse break-over voltages of the first, second and third Zener diodes ZD1, ZD2 and ZD3 are all 5.1V. The first and second N-type switching transistors Q2 and Q3 have the functions of short-circuiting the corresponding Zener diodes under the control of their respective gate signals. Thus, replacement is also possible by adopting other controllable switches with the same or similar functions.

The operation principle of the above-mentioned circuit will be further discussed below.

In the first phase:

1) When the pull-up unit 10 starts receiving the input voltage Vin (Vin=20V), the first, second and third Zener diodes ZD1, ZD2 and ZD3 in the voltage stabilizing unit 30 are turned on for operation, and there is current flowing through the pull-up resistor R1. Under the voltage stabilizing actions of the first, second and third Zener diodes ZD1, ZD2 and ZD3, the voltage at the second end of the pull-up resistor R1 (namely the gate voltage of the P-type switching transistor Q1) is controlled at about 15V. At this moment, the source and drain of the P-type switching transistor are conducted, then the source-drain current of the P-type switching transistor flows through the voltage dividing resistor R2, and the voltage of the output end 12 of the pull-up unit 10 starts rising and is greater than zero.

2) When the voltage of the output end 12 of the pull-up unit 10 rises, the gate voltage of the first N-type switching transistor Q2 rises in response, and the source and the drain are conducted to short-circuit the two ends of the third Zener diodes ZD3. At this moment, only the first and second Zener diodes ZD1 and ZD2 operate in the voltage stabilizing unit 30. Under the voltage stabilizing actions of the first and second Zener diodes ZD1 and ZD2, the voltage at the second end of the pull-up resistor R1 (namely the gate voltage of the P-type switching transistor Q1) is controlled at about 10V, and thereby voltage drop between two ends of the pull-up resistor R1 is increased, that is, the absolute value of the gate-source voltage difference (lower than zero) of the P-type switching transistor is increased. According to the operating characteristic curve of the P-type switching transistor, the source-drain current of the P-type switching transistor is also increased, so that the voltage of the output end 12 of the pull-up unit 10 continuously rises as long as the output voltage thereby is lower than the threshold voltage VT+ of the S Trigger. In this period, a high level is output by the S Trigger and then subjected to the inverter NOT, and thus the enabling signal of low level is output thereby to the enabling end EN of the IC chip, so that the IC chip does not start operating yet.

3) When the voltage of the output end 12 of the pull-up unit 10 rises to be higher than or equal to the threshold voltage VT+ of the S Trigger, a low level is output by the S Trigger outputs and then subjected to the inverter NOT, and thus the enabling signal of high level is output thereby to the enabling end EN of the IC chip, so that the IC chip starts operating.

In the second phase:

Because the voltage at the output end 22 of the trigger unit 20 is high, the source and the drain of the second N-type switching transistor Q3 are conducted to short-circuit the second and third Zener diodes ZD2 and ZD3 simultaneously. At this moment, only one first Zener diode ZD1 operates in the voltage stabilizing unit 30. Under the voltage stabilizing action of the first Zener diode ZD1, the voltage at the second end of the pull-up resistor R1 (namely the gate voltage of the P-type switching transistor Q1) is controlled at about 5V. At this moment, even in case of the input voltage Vin hasing large fluctuation, for example, a decline from 20V to 6V, there is a current flowing through the pull-up resistor R1 and the P-type switching transistor Q1 is thereby in a turn-on state as long as the input voltage Vin is higher than the reverse break-over voltage 5.1V of the first Zener diode ZD1 as well as the first Zener diode ZD1 thereby remains turn-on. At this moment, the voltage of the output end 12 of the pull-up unit 10 is approximate to the input voltage Vin but higher than or equal to the threshold voltage VT+ of the S Trigger, and the trigger unit 20 thus outputs the enabling signal of high level to the EN of the IC chip, so that the IC chip remains in normal operation without affected by the fluctuation of the input voltage. Certainly, the input voltage Vin should not be infinitely low. When the input voltage is lower than the reverse break-over voltage 5.1 V of the first Zener diode ZD1, the P-type switching transistor Q1 is turned off and the voltage of the output end 12 of the pull-up unit 10 is lower than the threshold voltage VT+ of the S Trigger, so that the IC chip stops operating.

From the foregoing, the circuit provided by the present disclosure for optimizing the input voltage range of the IC chip can ensure that the IC chip still can work in a normal manner when the input voltage is changed within a certain range.

The foregoing description is one embodiment regarding using the circuit for optimizing the input voltage range of the IC chip to stabilize the operation of, for example, the IC chip of a liquid crystal display device. Certainly, the present disclosure may also be used for driving IC chips of other types.

The regular lever of the input voltage Vin may also not be limited to 20V, and the fluctuation range may also not be limited to 20V to 6V, and selection of corresponding circuit elements and parameter setting thereof may be adjusted and modified according to specific requirements. For example, the number of the Zener diodes in the voltage stabilizing unit may not be limited to three, and Zener diodes with different reverse break-over voltages can be selected to constitute the voltage stabilizing unit.

The foregoing descriptions are merely preferred specific embodiments of the present disclosure, but the protection scope of the present disclosure is not limited thereto. Any variations or substitutions readily conceivable to anyone familiar with this art, within the disclosed technical scope of the present disclosure, shall be incorporated in the protection scope of the present disclosure. Accordingly, the protection scope of the present disclosure should be subjected to the protection scope of the claims.

The invention claimed is:

1. A circuit for optimizing an input voltage range of an IC chip, comprising:
 a pull-up unit, an input end thereof electrically connected with an input voltage, for pulling up a voltage level of an output end thereof based on the input voltage;
 a trigger unit, electrically connected between the pull-up unit and an enabling end of the IC chip, for comparing the voltage level output by the pull-up unit with a given threshold voltage, and outputting an enabling signal of a corresponding level to the enabling end of the IC chip based on the comparison result, so as to control the IC chip to start/stop; and
 a voltage stabilizing unit, a first input end of which is electrically connected to the output end of the pull-up unit, a second input end of which is electrically connected to the output end of the trigger unit, and an output end of which is electrically connected to a control end of the pull-up unit, for outputting a voltage of a corresponding level to the pull-up unit based on the voltages output by the pull-up unit and the trigger unit, so that the voltage level output by the pull-up unit is higher than or equal to the threshold voltage and thereby the IC chip starts operation, or so that the voltage level output by the pull-up unit is maintained to be higher than or equal to the threshold voltage and thereby the operation of the IC chip is not affected by variations of the input voltage;
wherein:
 the pull-up unit includes a P-type switching transistor, a pull-up resistor and a voltage dividing resistor,
 the source of the P-type switching transistor is electrically connected to a first end of the pull-up resistor, and used as the input end of the pull-up unit to receive the input voltage,
 the drain of the P-type switching transistor is used as the output end of the pull-up unit, and electrically grounded via the voltage dividing resistor,
 the gate of the P-type switching transistor is used as the control end of the pull-up unit, and electrically connected to a second end of the pull-up resistor,
 the trigger unit includes a Schmitt trigger and an inverter connected in series, and
 an input end of the Schmitt trigger is used as the input end of the trigger unit and electrically connected to the output end of the pull-up unit, and an output end of the inverter is used as the output end of the trigger unit and electrically connected to the enabling end of the IC chip.

2. The circuit of claim 1, wherein the voltage stabilizing unit includes a first, a second and a third Zener diode connected in series, and a first and a second switching transistor;

the cathode of the first Zener diode is electrically connected to the control end of the pull-up unit, the anode of the first Zener diode is electrically connected to the cathode of the second Zener diode, the anode of the second Zener diode is electrically connected to the cathode of the third Zener diode, and the anode of the third Zener diode is electrically grounded;

a first electrode and a second electrode of the first switching transistor are electrically connected to both ends of the third Zener diode, respectively, and the gate of the first switching transistor is electrically connected to the output end of the pull-up unit; and a first electrode and a second electrode of the second switching transistor are electrically connected to the cathode of the second Zener diode and the anode of the third Zener diode, respectively, and the gate of the second switching transistor is electrically connected to the output end of the trigger unit.

3. The circuit of claim 2, wherein the first and second switching transistors are N-type switching transistors.

4. The circuit of claim 2, wherein the first and second switching transistors are P-type switching transistors.

5. A method for a circuit optimized with an input voltage range of an IC chip, the circuit comprising:
 a pull-up unit;
 a trigger unit, electrically connected between the pull-up unit and an enabling end of the IC chip, and
 a voltage stabilizing unit, a first input end of which is electrically connected to the output end of the pull-up unit, a second input end of which is electrically connected to the output end of the trigger unit, an output end of which is electrically connected to a control end of the pull-up unit;

the method including steps of:
 receiving, by a pull-up unit, an input voltage, and then outputting a corresponding voltage level;
 comparing, by a trigger unit, the voltage level output by the pull-up unit with a given threshold voltage, and outputting an enabling signal of corresponding level to an enabling end of the IC chip based on the comparison result, so as to control the IC chip to start/stop; and
 receiving, by a voltage stabilizing unit, the voltage levels output by the pull-up unit and the trigger unit, and then outputting a voltage of corresponding level to the pull-up unit based on the voltage levels output by the pull-up unit and the trigger unit, so that the voltage level output by the pull-up unit is higher than or equal to the threshold voltage and thereby the IC chip starts operation, or so that the voltage level output by the pull-up unit is maintained to be higher than or equal to the threshold voltage and thereby the operation of the IC chip is not affected by variations of the input voltage, wherein
 the pull-up unit includes a P-type switching transistor, a pull-up resistor and a voltage dividing resistor;
 the source of the P-type switching transistor is electrically connected to a first end of the pull-up resistor, and used as the input end of the pull-up unit to receive the input voltage,
 the drain of the P-type switching transistor is used as the output end of the pull-up unit, and electrically grounded via the voltage dividing resistor,
 the gate of the P-type switching transistor is used as the control end of the pull-up unit, and electrically connected to a second end of the pull-up resistor, and
 the trigger unit of the circuit includes a Schmitt trigger and an inverter connected in series, wherein an input end of the Schmitt trigger is used as the input end of the trigger unit and electrically connected to the output end of the pull-up unit, and an output end of the inverter is used as the output end of the trigger unit and electrically connected to the enabling end of the IC chip.

6. The method of claim 5, wherein,
the voltage stabilizing unit of the circuit includes a first, a second and a third Zener diode connected in series and a first and a second switching transistor; the cathode of the first Zener diode is electrically connected to the control end of the pull-up unit, the anode of the first Zener diode is electrically connected to the cathode of the second Zener diode, the anode of the second Zener diode is electrically connected to the cathode of the third Zener diode, and the anode of the third Zener diode is electrically grounded; a first electrode and a second electrode of the first switching transistor are electrically connected to both ends of the third Zener diode, respectively, and the gate of the first switching transistor is electrically connected to the output end of the pull-up unit; and a first electrode and a second electrode of the second switching transistor are electrically connected to the cathode of the second Zener diode and the anode of the third Zener diode, respectively, and the gate of the second switching transistor is electrically connected to the output end of the trigger unit.

* * * * *